(12) United States Patent
Qian et al.

(10) Patent No.: US 9,142,581 B2
(45) Date of Patent: Sep. 22, 2015

(54) DIE SEAL RING FOR INTEGRATED CIRCUIT SYSTEM WITH STACKED DEVICE WAFERS

(71) Applicant: OmniVision Technologies, Inc., Santa Clara, CA (US)

(72) Inventors: Yin Qian, Milpitas, CA (US); Hsin-Chih Tai, San Jose, CA (US); Tiejun Dai, Santa Clara, CA (US); Duli Mao, Sunnyvale, CA (US); Cunyu Yang, Milpitas, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/669,107

(22) Filed: Nov. 5, 2012

(65) Prior Publication Data

US 2014/0124889 A1 May 8, 2014

(51) Int. Cl.
*H01L 27/146* (2006.01)
*H01L 23/58* (2006.01)
*H01L 23/00* (2006.01)

(52) U.S. Cl.
CPC ........ *H01L 27/14618* (2013.01); *H01L 23/585* (2013.01); *H01L 24/94* (2013.01); *H01L 27/14636* (2013.01); *H01L 27/14683* (2013.01); *H01L 24/05* (2013.01); *H01L 24/08* (2013.01); *H01L 2224/04042* (2013.01); *H01L 2224/05567* (2013.01); *H01L 2224/08145* (2013.01); *H01L 2224/80896* (2013.01); *H01L 2224/9202* (2013.01); *H01L 2224/94* (2013.01); *H01L 2924/00014* (2013.01); *H01L 2924/10253* (2013.01); *H01L 2924/10329* (2013.01); *H01L 2924/1434* (2013.01); *H01L 2924/37001* (2013.01)

(58) Field of Classification Search
USPC ........................... 257/448, E21.122; 438/455
See application file for complete search history.

(56) References Cited

U.S. PATENT DOCUMENTS

| | | | | |
|---|---|---|---|---|
| 4,785,341 A * | 11/1988 | Ning et al. | ..................... | 257/554 |
| 6,927,432 B2 * | 8/2005 | Holm et al. | ................... | 257/290 |
| 7,453,150 B1 * | 11/2008 | McDonald | .................... | 257/774 |
| 7,642,173 B2 * | 1/2010 | McDonald | .................... | 438/455 |
| 7,855,455 B2 | 12/2010 | Purushothaman et al. | | |
| 8,017,451 B2 * | 9/2011 | Racz et al. | ..................... | 438/127 |

(Continued)

OTHER PUBLICATIONS

Kwon et al., "Wafer Bonding Using Low-K Dielectrics as Bonding Glue in Three-Dimensional Integration," Interconnections for Gigascale Integration, Rensselaer Polytechnic Institute, Troy, New York, 12180 (1 page).

(Continued)

*Primary Examiner* — Jaehwan Oh
(74) *Attorney, Agent, or Firm* — Blakely Sokoloff Taylor & Zafman LLP

(57) ABSTRACT

An integrated circuit system includes a first device wafer bonded to a second device wafer at a bonding interface of dielectrics. Each wafer includes a plurality of dies, where each die includes a device, a metal stack, and a seal ring that is formed at an edge region of the die. Seal rings included in dies of the second device wafer each include a first conductive path provided with metal formed in a first opening that extends from a backside of the second device wafer, through the second device wafer, and through the bonding interface to the seal ring of a corresponding die in the first device wafer.

12 Claims, 15 Drawing Sheets

(56) References Cited

U.S. PATENT DOCUMENTS

| | | | |
|---|---|---|---|
| 8,093,099 B2* | 1/2012 | Purushothaman et al. | 438/107 |
| 8,168,529 B2* | 5/2012 | Lin et al. | 438/622 |
| 8,273,660 B2* | 9/2012 | Park et al. | 438/690 |
| 8,283,771 B2* | 10/2012 | Somasekhar et al. | 257/698 |
| 8,535,984 B2* | 9/2013 | Racz et al. | 438/118 |
| 2004/0219763 A1* | 11/2004 | Kim et al. | 438/455 |
| 2008/0150089 A1* | 6/2008 | Kwon et al. | 257/621 |
| 2009/0042365 A1* | 2/2009 | McDonald | 438/459 |
| 2010/0187671 A1* | 7/2010 | Lin et al. | 257/686 |
| 2011/0095395 A1 | 4/2011 | Ellul et al. | |
| 2012/0074584 A1 | 3/2012 | Lee et al. | |
| 2012/0105696 A1 | 5/2012 | Maeda | |
| 2012/0190189 A1 | 7/2012 | Farooq et al. | |

OTHER PUBLICATIONS

Motoyoshi et al., "3D-LSI Technology for Image Sensor," Pixel 2008 International Workshop, Fermilab, Batavia, IL, Sep. 23-26, 2008 (14 pages).

Peng et al., "Fine-Pitch Bump-Less Cu—Cu Bonding for Wafer-On-Wafer Stacking and Its Quality Enhancement," Institute of Microelectronics, Nanyang Technological University, Singapore (5 pages).

KR 2013-0037058—Korean Notice of Preliminary Rejection, issued Mar. 26, 2014, no English translation available (5 pages).

U.S. Appl. No. 13/441,627, filed Apr. 6, 2012, Yin Qian et al.

TW 102125986—First Taiwan Office Action with English translation, 19 pages, issued Jun. 25, 2015.

* cited by examiner

US 9,142,581 B2

DIE SEAL RING FOR INTEGRATED CIRCUIT SYSTEM WITH STACKED DEVICE WAFERS

TECHNICAL FIELD

This disclosure relates generally to semiconductor processing, and in particular but not exclusively, relates to semiconductor processing of stacked integrated circuit systems.

BACKGROUND INFORMATION

A semiconductor chip, or die (such as an image sensor chip) is fabricated on a single semiconductor wafer, along with hundreds and in some cases thousands of copies of the same die. Separating a semiconductor wafer into individual dies can be done with a die saw (such as a diamond saw). Cuts are made along areas of non-functional semiconductor material separating each die known as scribe lines. However, using a diamond saw introduces mechanical stress to the semiconductor wafer and can result in cracking at the die edge and compromising the integrity and reliability of the integrated circuit. One structure used to make a die less susceptible to the mechanical stress of die saws are seal rings. A die seal ring is formed in or on an outer edge region of one or more dielectric layers of a semiconductor substrate to protect the integrated circuit from contaminants (e.g. sodium) and make a die less susceptible to the mechanical stress caused by the die saw.

As integrated circuit technologies continue to advance, there are continuing efforts to increase performance and density, improve form factor, and reduce costs. The implementation of stacked three dimensional integrated circuits have been one approach that designers sometimes use to realize these benefits. Some examples of where three dimensional integrated circuits are a suitable consideration include stacking memory on top of image sensors or processor chips, stacking memory on top of processor chips, stacking processor chips on top of image sensors, stacking chips that are fabricated with different fabrication processes, stacking two small integrated circuit chips whose separate yield may be higher than one large one, or stacking chips to reduce the integrated circuit system footprint.

However, the mechanical stresses caused by die saws when separating dies out of a stacked three dimensional integrated circuit remains a factor to be addressed. Furthermore, there is an additional weakness created at the bonding interface between the stacked wafers.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a Die Seal Ring for Integrated Circuit System with Stacked Device Wafers are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Directional terminology such as "top", "down", "above", "below" are used with reference to the orientation of the figure(s) being described.

Figure 1A:
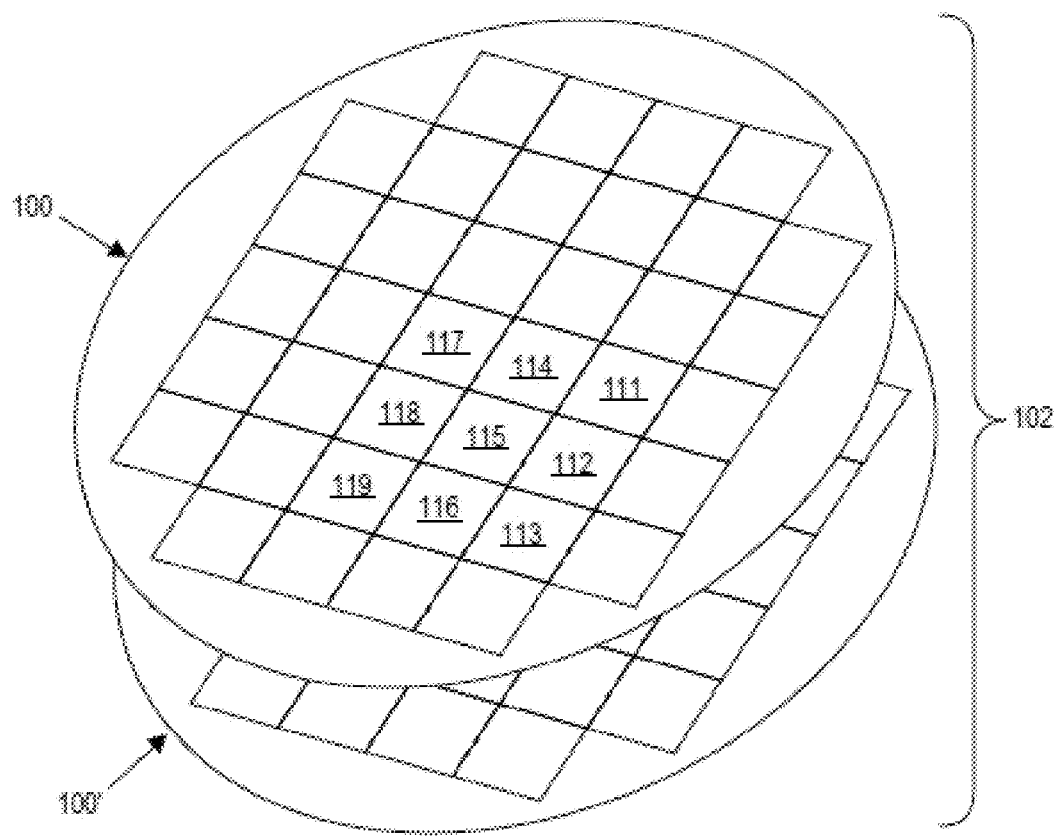
FIG. 1A is an exploded view of stacked semiconductor wafers with integrated circuit dies, in accordance with an embodiment of the invention.

FIG. 1A is an exploded view of stacked device wafers 100 and 100' that are to be bonded together to form an integrated circuit system 102, in accordance with an embodiment of the invention. Device wafers 100 and 100' may include silicon, or gallium arsenide or other semiconductor materials. In the illustrated example, device wafer 100 includes semiconductor dies 111-119 while device wafer 100' includes corresponding semiconductor dies (view obscured in FIG. 1A).

Figure 1B:
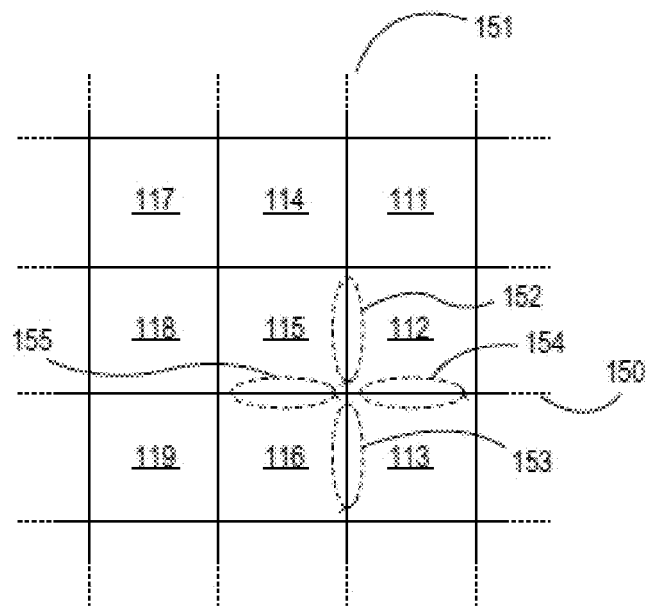
FIG. 1B is a diagram illustrating in greater detail the integrated circuit dies shown in FIG. 1A.

FIG. 1B is a diagram illustrating in greater detail device wafer 100 and dies 111 thru 119. Scribe lines 150 and 151 separate adjacent dies. Scribe line regions 152, 153, 154, and 155 show areas that are typically susceptible to mechanical stress caused by die saws running across semiconductor wafer 100 when separating the individual dies from the stacked wafers. Accordingly, a seal ring may be included in each die for both wafers 100 and 100' to act as a stress release, a crack stopper, and/or as a moisture/contaminant barrier.

Figure 2:
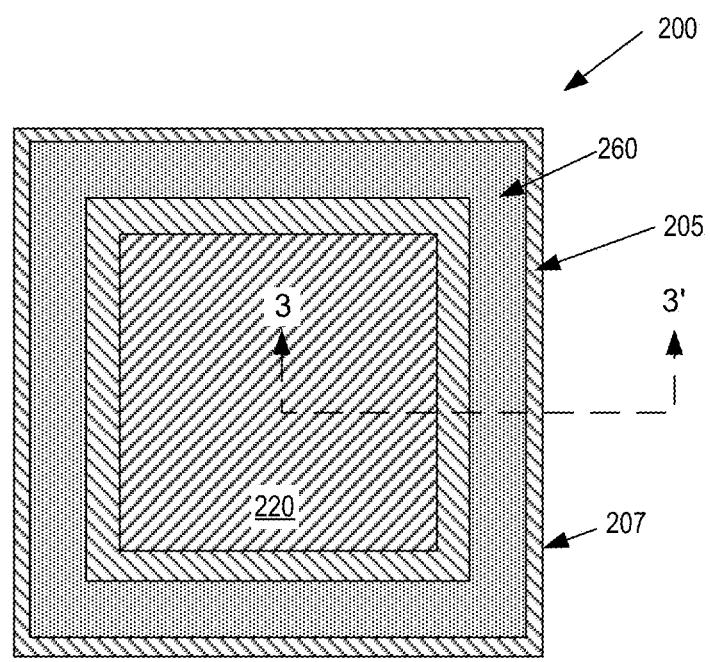
FIG. 2 is a plan view of an integrated circuit die with a seal ring, in accordance with an embodiment of the invention

FIG. 2 is a plan view of an integrated circuit die 200 with a seal ring 260, in accordance with an embodiment of the invention. Integrated circuit die 200 may be one implementation of any of the integrated circuit dies of FIGS. 1A and 1B. Seal ring 260 is formed in dielectric layers of a metal stack in an outer edge region 205 of die 200. Also, seal ring 260 surrounds an integrated circuit region 220. In one embodiment, outer edge region 205 only includes non-functional semiconductor material. That is, outer edge region 205, in one example, may not include any integrated circuits, whereas integrated circuit region 220 may comprise one or more semiconductor regions, such as imaging arrays, readout circuitry, control circuitry, processors, memory, or other functional circuitry. Also, in one embodiment, outer edge region 205 may extend from integrated circuit region 220 all the way to an outer edge 207 of die 200.

Seal ring 260 may protect integrated circuit region 220 from contaminants (e.g. sodium) and may make metal interconnects and dielectric layers of the semiconductor substrate of devices within integrated circuit region 220 less susceptible to the mechanical stress caused by die saw or other processes employed to separate multiple dies formed on a semiconductor wafer. Seal ring 260 may include metal such as aluminum, tungsten or an alloy of other metals.

Figure 3:
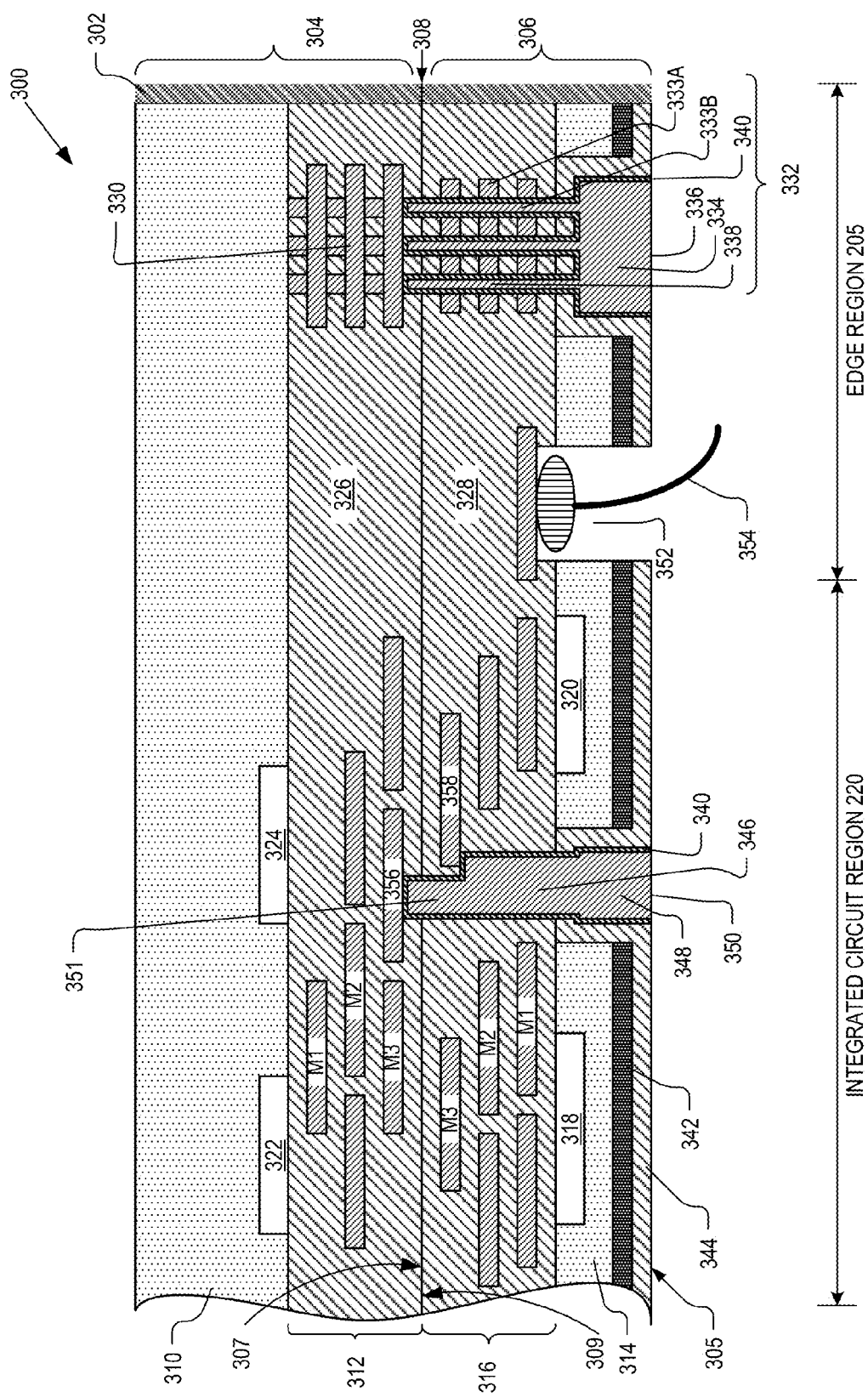
FIG. 3 is a cross-sectional view of an integrated circuit system having stacked device wafers, taken along section lines 3-3' of FIG. 2, in accordance with an embodiment of the invention.

FIG. 3 is a cross-sectional view of an integrated circuit system 300 having stacked device wafers 304 and 306, taken along section lines 3-3' of FIG. 2, in accordance with an embodiment of the invention. Integrated circuit system 300 is one possible implementation of integrated circuit system 102 of FIG. 1A. The illustrated example of integrated circuit system 300 includes a scribe line 302, a first device wafer 304, a second device wafer 306, and a bonding interface 308. The first device wafer 304 includes a first semiconductor layer 310 and a first metal stack 312, while the second device wafer 306 is shown as including a second semiconductor layer 314 and a second metal stack 316. Semiconductor layer 310 is shown as including semiconductor regions 322 and 324 and metal stack 312 is shown as including metal layers M1, M2, and M3, dielectric layers 326, a conductor 356, and seal ring 330. Semiconductor layer 314 is shown as including semiconductor regions 318 and 320 and metal stack 316 is shown as including metal layers M1, M2, and M3, dielectric layers 328, conductor 358, and seal ring 332. The illustrated example of seal ring 332 includes an opening 334, metal 336, conductive path 338, and a barrier metal deposition 340. Also shown in FIG. 3 is an optional interconnect 351 included in the integrated circuit region 220. Optional interconnect 351 includes barrier metal deposition 340, conductive path 346, opening 348, and, metal 350. Semiconductor layer 314 is further shown as including passivation layer 342 and an oxide deposition 344. Passivation layer 342 may be included for planarization of the backside 305 of device wafer 306. Optional wire bond cavity 352 and wire bond 354 are further shown as included on the backside 305 of device wafer 306.

In the example illustrated of FIG. 3, it is noted that all of the conductors included in the metal stack 312 are entirely beneath the front side 309 surface of first device wafer 304. Similarly, it is noted that all of the conductors with the exception of conductive path 346 and conductive path 338 of the metal stack 316 are entirely beneath the front side 307 surface of second device wafer 306. Therefore, in the depicted example, bonding interface 308 includes an dielectric-to-dielectric bonding between first dielectric layer 326 and second dielectric layer 328. In another example, it is appreciated that if one of the metal layers M1-M3 includes conductors that are flush with the surface of front side 307 or front side 309, then the bonding interface 308 may be an dielectric-to-conductor interface. However, in either example, at least one of the surfaces at bonding interface 308 includes a dielectric-only surface of first dielectric layer 326 and/or second dielectric layer 328 in accordance with the teachings of the present invention. Therefore, in one example, bonding interface 308 is a dielectric bonding interface in accordance with the teachings of the present invention.

In one embodiment, either or both of semiconductor layer 310 and semiconductor layer 314 are layers of epitaxially grown silicon. As shown, semiconductor layer 314 includes semiconductor regions 318 and 320 formed in a front side of the semiconductor layer 314, while semiconductor layer 310 includes semiconductor region 322 and 324 formed in a front side of semiconductor layer 310. In one embodiment, as will be discussed in more detail below, semiconductor region 318 includes a CMOS imaging array and semiconductor region 320 includes associated peripheral circuitry, such as a readout circuit, a control circuit, or other function circuitry included in a CMOS image sensor. Continuing with this example, components such as the photosensitive regions, source and drain regions of transistors are included in the CMOS imaging array of semiconductor region 318, while semiconductor regions 322 and 324 may include an image processor and/or memory for processing and storing image data that is read out of the CMOS imaging array included in semiconductor region 318. Thus, device wafers 304 and 306 may be bonded together to form an integrated circuit system, such as an imaging sensor system that includes devices on the first device wafer 304 as well as devices on the second device wafer 306. As will be shown below, semiconductor regions 318, 320, 322, and 324 may be formed in their respective semiconductor layer prior to bonding the device wafers 304 and 306 together.

First metal stack 312 is shown as disposed on the front side of semiconductor layer 310 and includes several metal layers M1-M3 separated by dielectric layer 326. Included in metal layer M3 is a conductor 356. Dielectric layer 326 separate adjacent metal interconnect layers of metal stack 312 as well as the metal interconnect layers from semiconductor layer 310 and bonding interface 308. Similarly, dielectric layer 328 separate adjacent metal interconnect layers of metal stack 316, as well as its metal interconnect layers from semiconductor layer 314 and bonding interface 308. In the illustrated embodiment, metal stacks 312 and 316 each include three metal interconnect layers. In other embodiments of the invention, each metal stack may have more or less metal layers. In some embodiments, the metal interconnect layers M1, M2 and M3 may include tungsten, aluminum, cooper, an aluminum-copper alloy or other alloys.

Included in metal stack 312 is a seal ring 330. Seal ring 330 is formed in the outer edge region 205 of the die proximate to scribe line 302. The metallization layers of seal ring 330 are connected by vias from lower metal layer M1 to upper metal layer M3. In one embodiment, seal ring 330 is formed at the same time and using the same processing steps used to form the rest of metal stack 312. Thus, seal ring 330 is formed prior to bonding wafers 304 and 306 together. Seal ring 330 may include tungsten, aluminum, cooper, an aluminum-copper alloy or other alloys.

Metal stack 316 is shown as including a seal ring 332 that includes metallization 333A and vias 333B. In one embodiment, as will be discussed below, metallization 333A is formed prior to the bonding of wafers 304 and 306, while vias 333B are formed after the bonding. Thus, metallization 333A may be considered a frame that exists prior to bonding, and after bonding forms seal ring 332 together with vias 333B once the vias are completed. Seal ring 332 is formed by etching an opening 334 from the backside 305 of device wafer 306. The opening 334 extends from the backside 305 through the device wafer 306, through bonding interface 308 and through dielectric layer 326 to expose the metallization of seal ring 330. In one embodiment, a barrier metal deposition 340 is deposited in opening 334 and then opening 334 is filled with metal 336, such that seal ring 332 is coupled to seal ring 330 through the metal 346 and through barrier metal deposition 340.

Seal ring 330 coupled together with seal ring 332 act as a stress release, a crack stopper, and/or as a moisture/contaminant barrier for integrated circuit system 300. Furthermore, seal ring 332 acts to reinforce the bonding interface 308 by restricting lateral shifting as well as vertical separation of the wafers.

Also shown in FIG. 3 are passivation layer 342 and oxide deposition 344. Oxide deposition 344 is disposed between the metal 334 and the semiconductor layer 314. Passivation layer is disposed between the backside 305 of device wafer 306 and semiconductor layer 314.

FIG. 3 further illustrates an optional wire bond cavity 352 and a wire bond 354 that are formed to provide a package connection from a conductor in metal stack 316. FIG. 3 also illustrates an optional interconnect 351 formed in the integrated circuit region 220 for connecting conductor 358 of metal stack 316 with conductor 356 of metal stack 312. In one embodiment, interconnect 351 is formed at the same time, using the same process steps as are used to form seal ring 332. Interconnect 351 electrically couples metal conductor 356 with metal conductor 358 and may be used for transferring signals between devices included in device wafer 304 with devices included in device wafer 306. Interconnect 351 includes an opening 348 that extends from the backside 305 of device wafer 306, through device wafer 306, through bonding interface 308 and through dielectric layer 326 to expose metal conductor 356. Similar to seal ring 332, barrier metal deposition 340 is deposited in opening 348 which is then filled with metal 350. In one embodiment, metal 350 is the same metal as metal 336 used in the seal ring 332 and may include tungsten, aluminum, cooper, an aluminum-copper alloy or other alloys.

Figure 4:
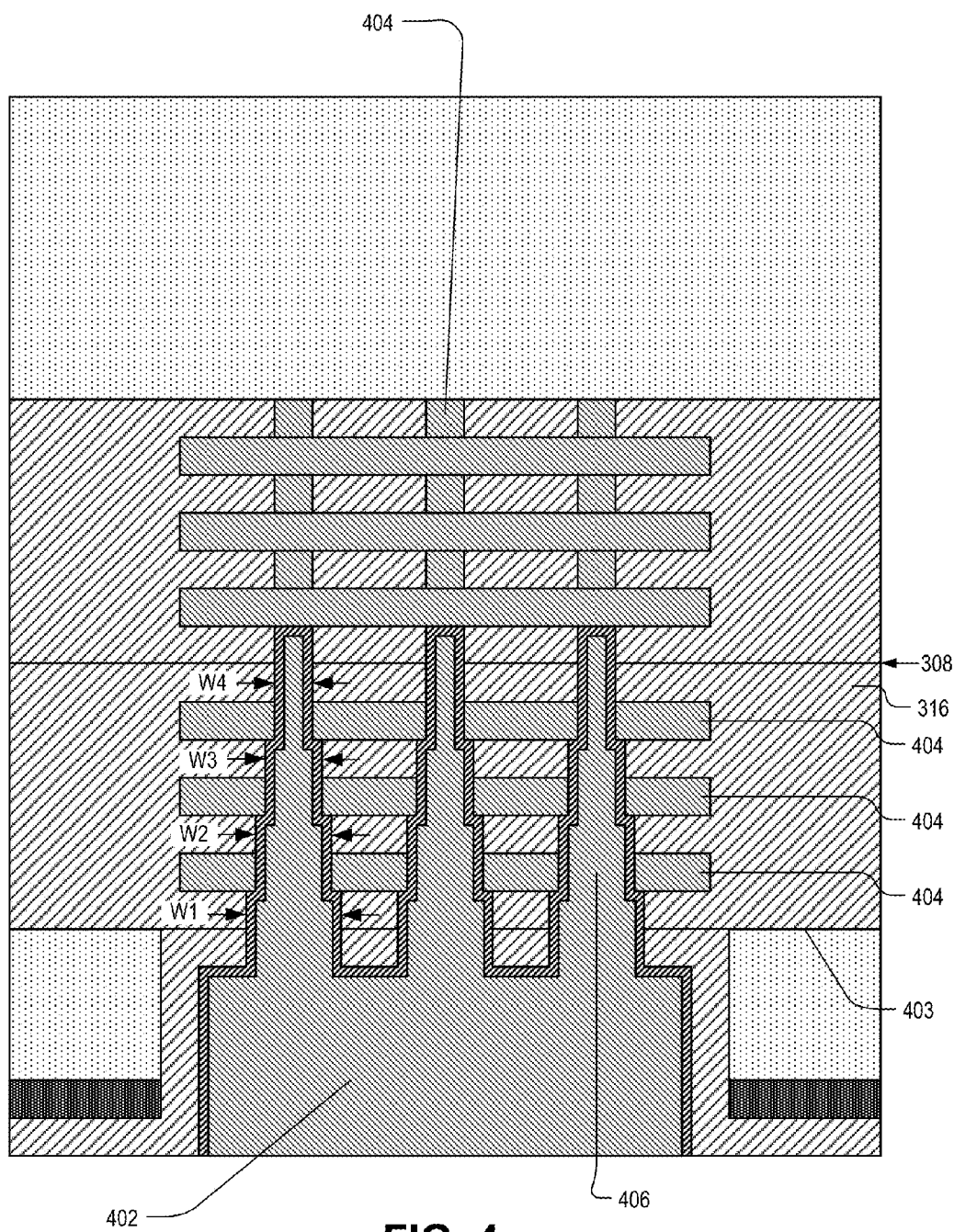
FIG. 4 is a cross-sectional view of a die seal ring, in accordance with an embodiment of the invention.

FIG. 4 is a cross-sectional view of a die seal ring 402, in accordance with an embodiment of the invention. Die seal ring 402 is one possible implementation of die seal ring 332 of FIG. 3. Die seal ring 402 is shown as including metallizations 404 and vias 406. As shown, the vias (i.e., conductive path) 406 of seal ring 402 may include a variety of widths (e.g., W1-W4). In particular, the width W4 at bonding interface 308 may be less than the width W3, and width W3 less than width W2, and width W2 less than the width W1 at a backside 403 of metal stack 316. Having staggered widths such this may provide for greater surface area contact between the vias 406 and metallizations 404.

Figure 5:
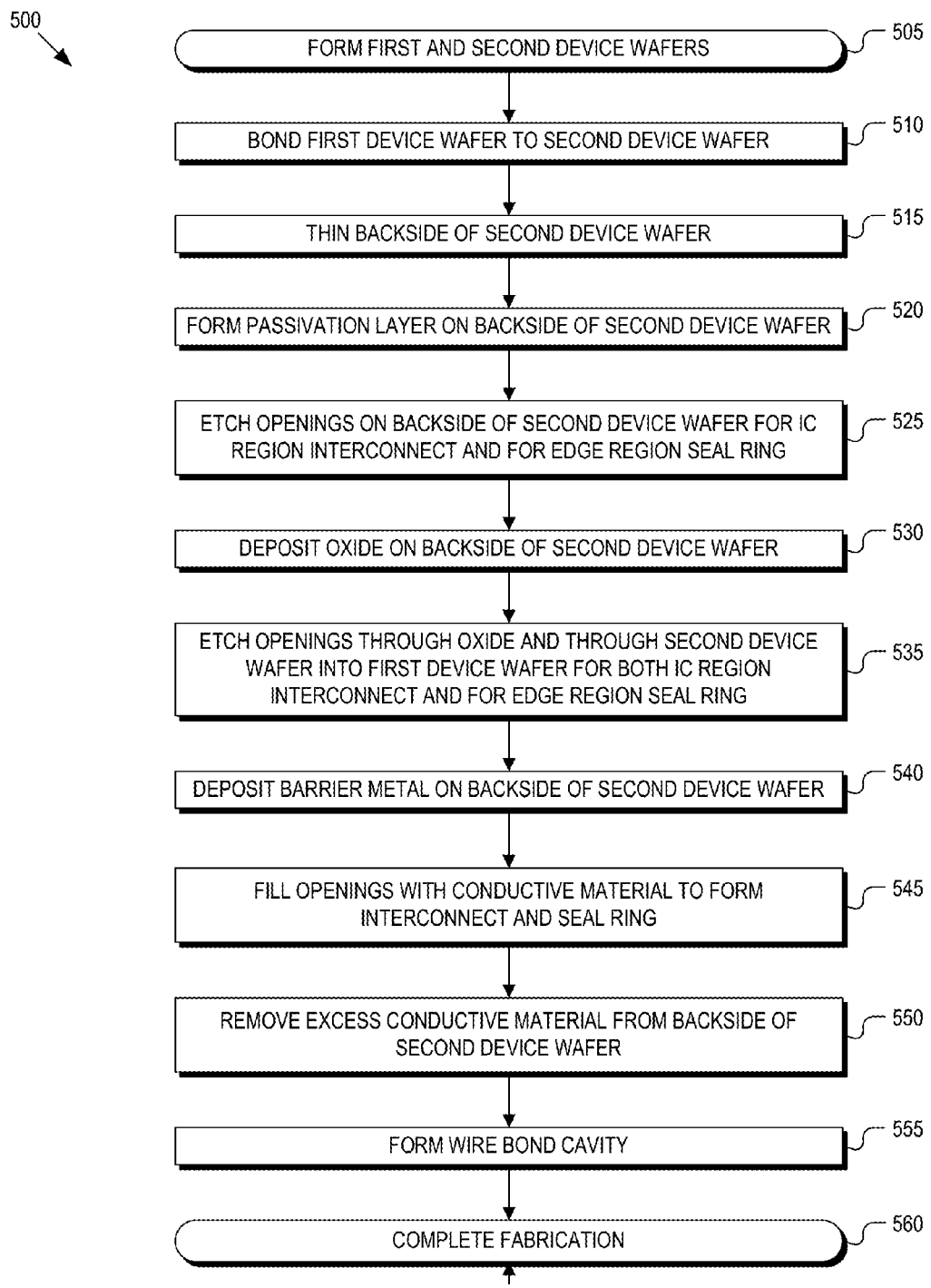
FIG. 5 is a flow chart illustrating a process of fabricating an integrated circuit system with a die seal ring, in accordance with an embodiment of the invention.

FIG. 5 is a flow chart illustrating a process 500 of fabricating an integrated circuit system with a die seal ring, in accordance with an embodiment of the invention. Process 500 will be described with reference to FIGS. 6A-6H which illustrate cross-sectional views of the integrated circuit system corresponding with process 500 of FIG. 5. Process 500 is one possible process for the fabrication of any of the previously disclosed integrated circuit systems including integrated circuit system 102 of FIG. 1A and integrated circuit system 300 of FIG. 3.

Figure 6A:
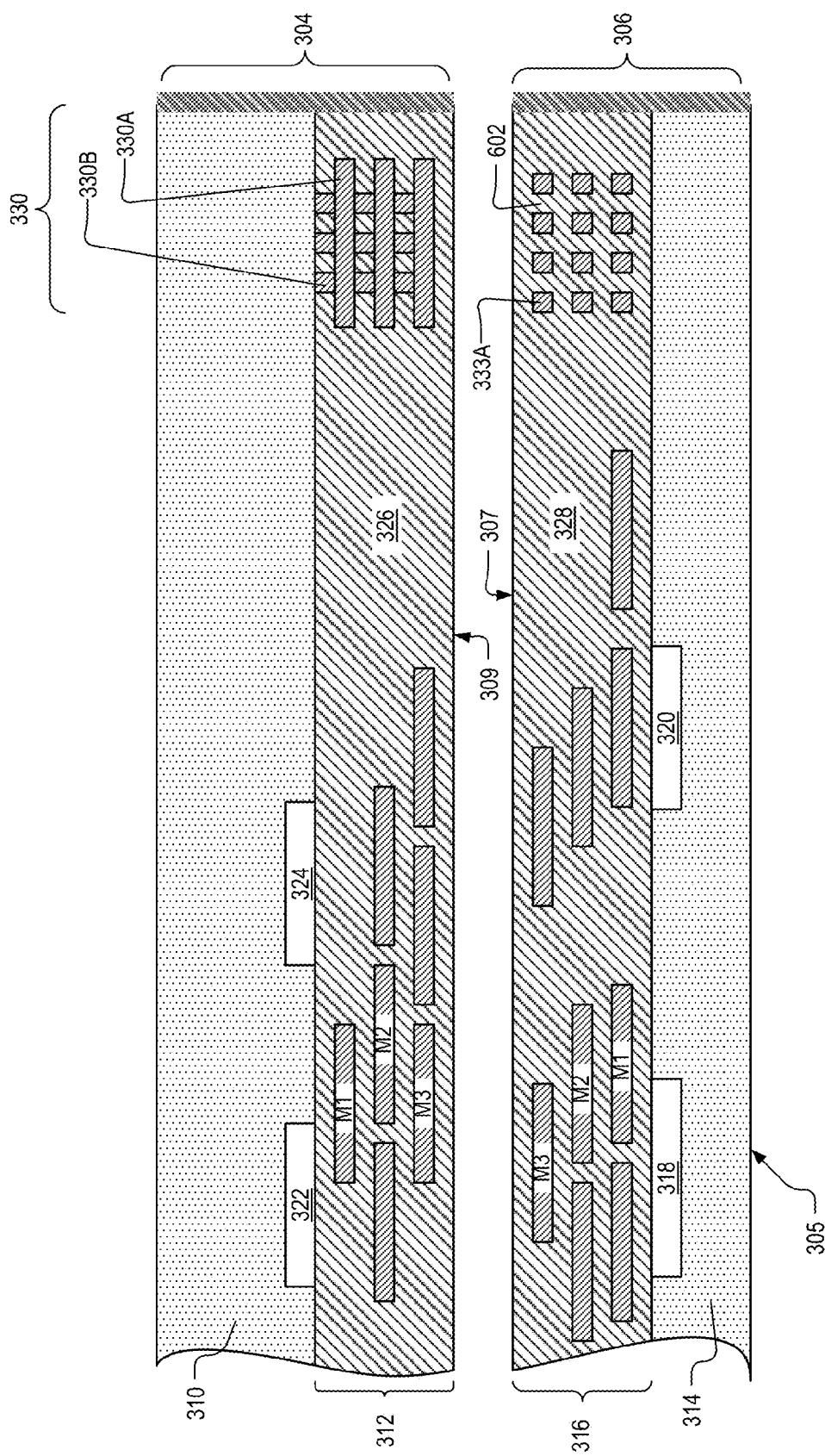
FIGS. 6A-6H illustrate cross-sectional views of an integrated circuit system corresponding with the method of fabricating of FIG. 5.

Process 500 may begin at process block 505 and FIG. 6A where the first and second device wafers (i.e., 304 and 306) are formed. As previously mentioned, formation of first device wafer 304 may include the formation of semiconductor regions 322 and 324, metal stack 312, and seal ring 330. The formation of device wafer 306 may include the formation semiconductor regions 318 and 320, metal stack 316, and a seal ring frame that includes metallization 333A with gaps 602. In one embodiment, one or both of front side 307 and front side 209 is flattened by a chemical mechanical polish.

Figure 6B:
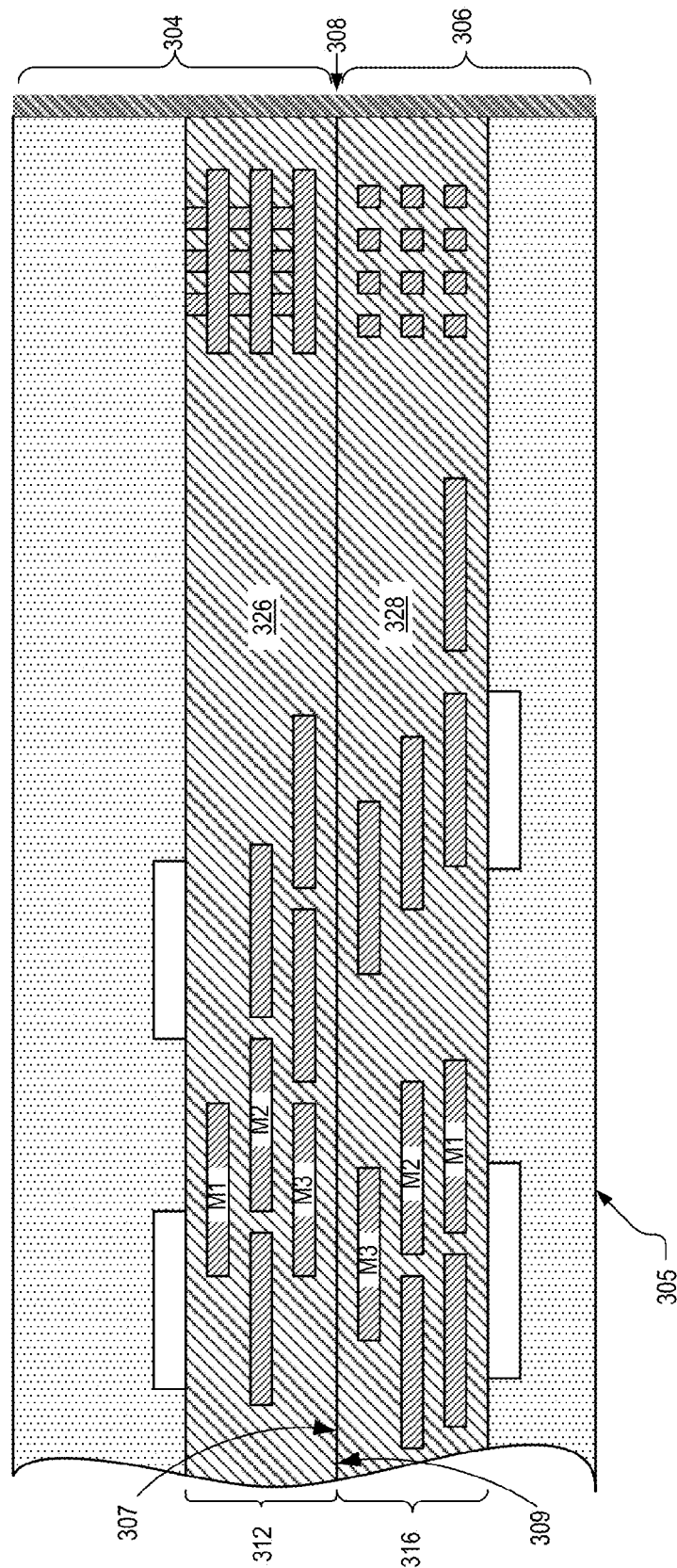

In process block 510 first device wafer 304 is bonded to second device wafer 306 to form a bonding interface 308 between dielectric layers 326 and 328, as shown in FIG. 6B. In the illustrated embodiment, all of the conductors of metal stack 312 are within the stack beneath the front side surface 309 of device wafer 304. Similarly, all of the conductors of metal stack 316 are within the stack beneath the front side surface 307 of device wafer 306. In one embodiment dielectric layers 326D and 328D each comprise an oxide. Thus, bonding interface 308 is an oxide to oxide interface without any metal at either surface 307 or 309.

Figure 6C:
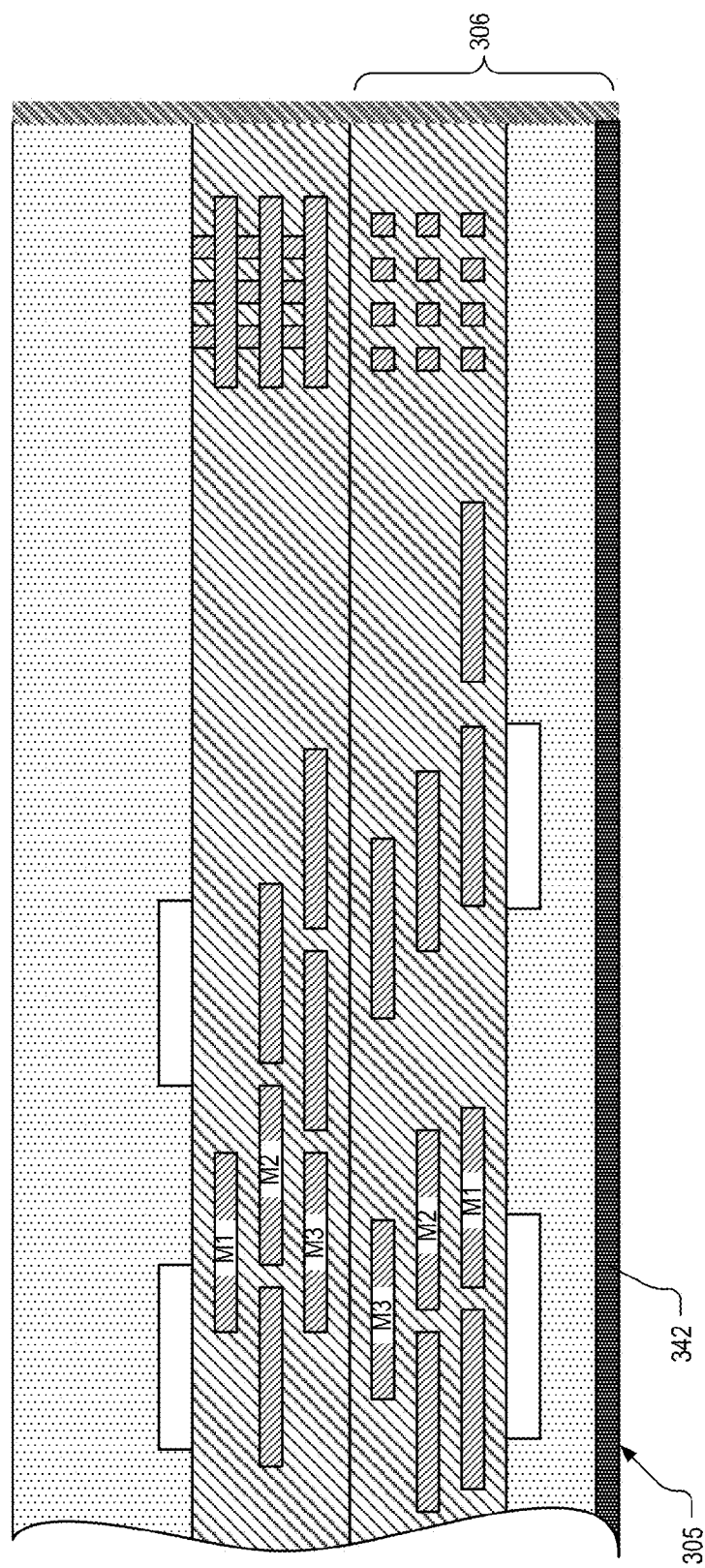

Next, in process block 515 and as shown in FIG. 6C, the backside 305 is thinned and in process block 520, passivation layer 342 is formed on the thinned device wafer 306. Passivation layer 342 may be utilized to planarize the backside 305 of the thinned device wafer 306.

Figure 6D:
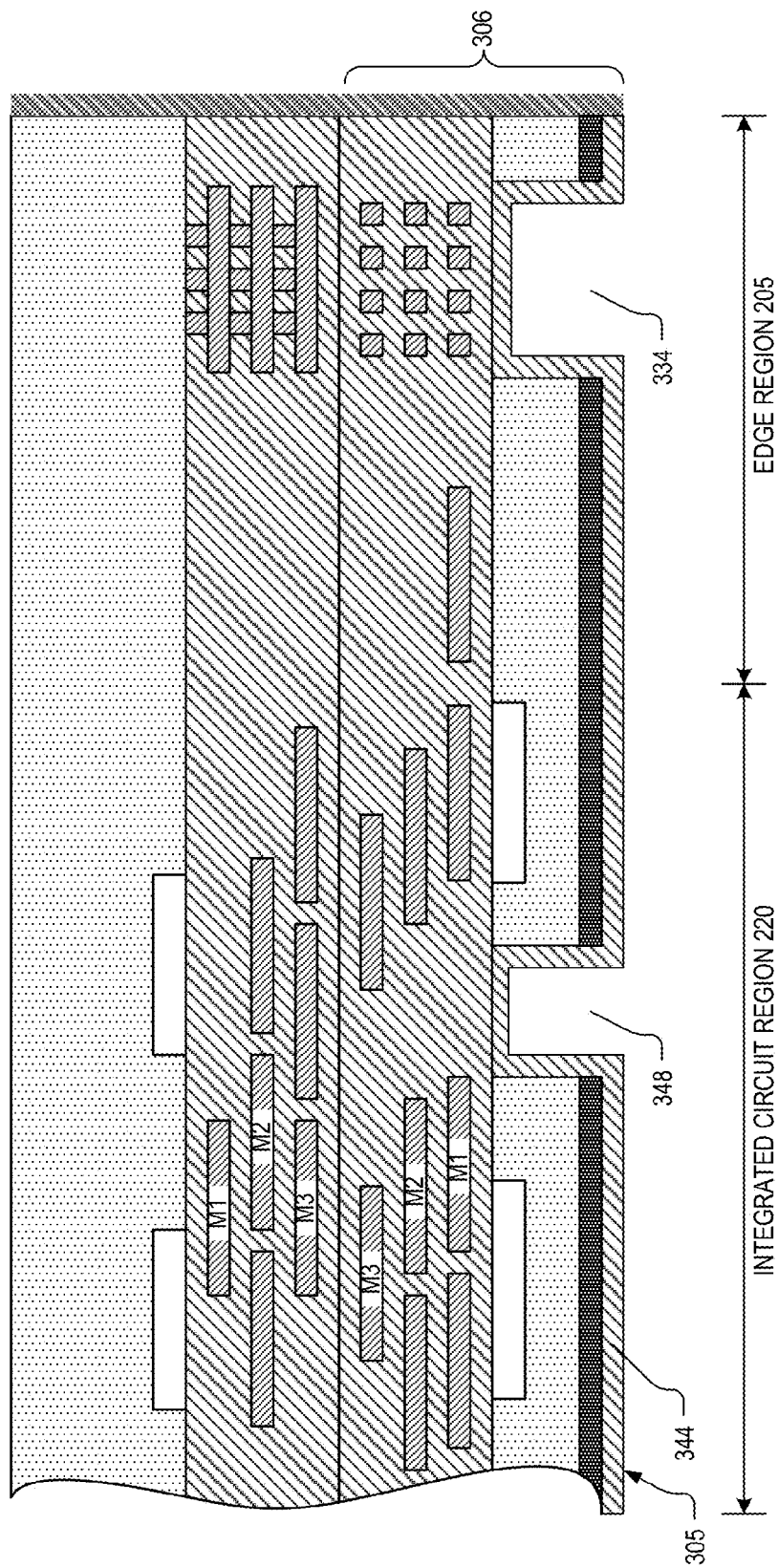

In process block 525, openings 334 and 348 are etched for the edge region seal ring and for the integrated circuit region interconnect, respectively (see FIG. 6D). Also shown in FIG. 6D, is a oxide deposition 344 that is deposited on the backside 305 of device wafer 306 and in the etched openings 334 and 348 (i.e., process block 530). In one embodiment, opening 334 and opening 348 are etched simultaneously in the same process step. For example, a single mask may be used to etch both opening 334 and opening 348 in a single etching process step.

Figure 6E:
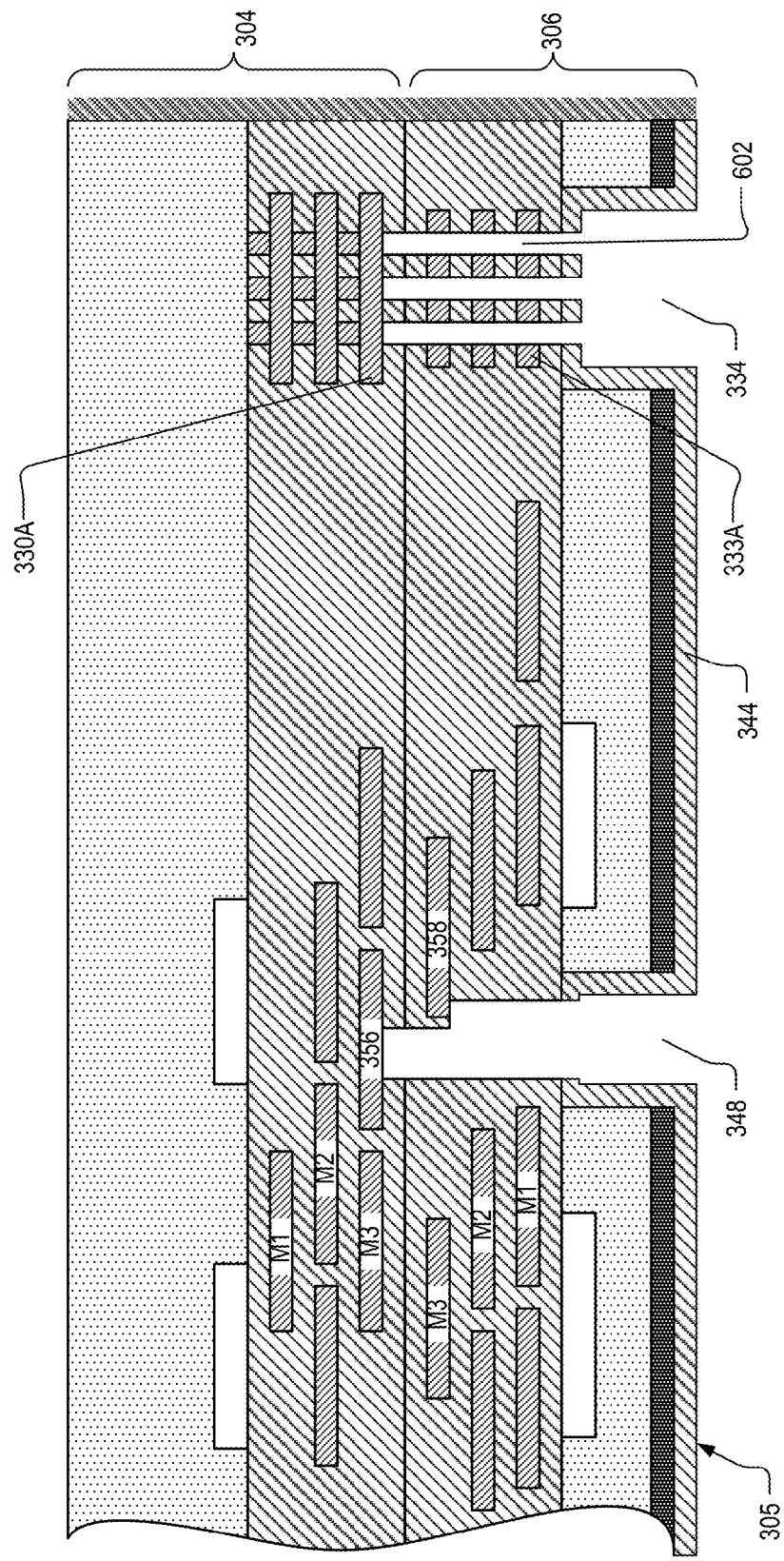

Process block 535 and FIG. 6E illustrate the extension of openings 334 and 348 with an etch through oxide deposition 344, from the backside 305, through device wafer 306, and into device wafer 304. In particular, this etch step extends openings 334 and 348 through dielectric layer 326 to expose both conductor 356 and the metallization 330A of seal ring 332. Also, as can be seen in FIG. 6E, the extension of opening 334 for seal ring 332 results in an etched opening in the gaps 602 between the metallizations 333A. The extension of openings 334 and opening 348 may be performed in a simultaneous etching process. For example, a single mask may be used to etch both opening 334 and opening 348 to extend the respective openings in a single etching process step.

Figure 6F:
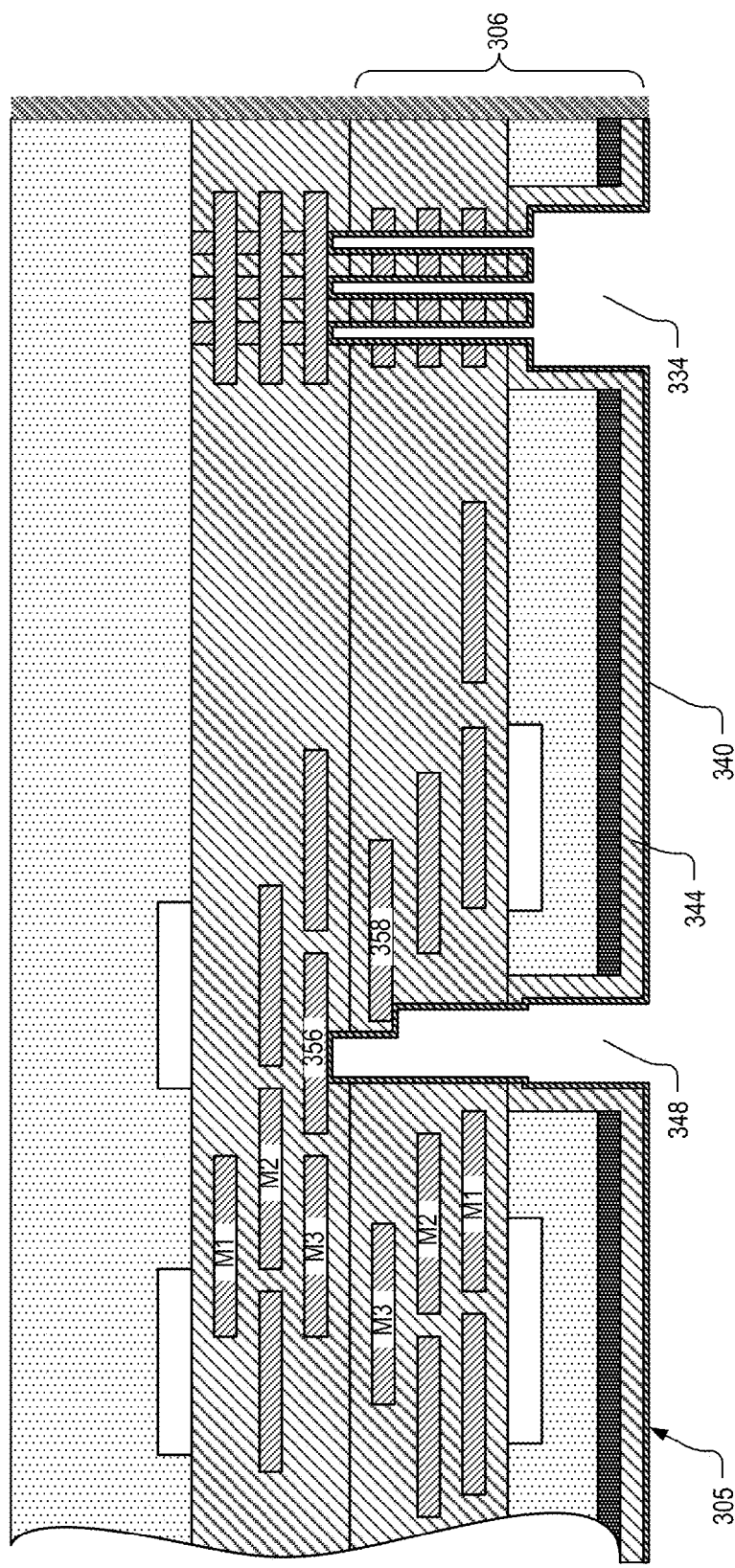
Figure 6G:
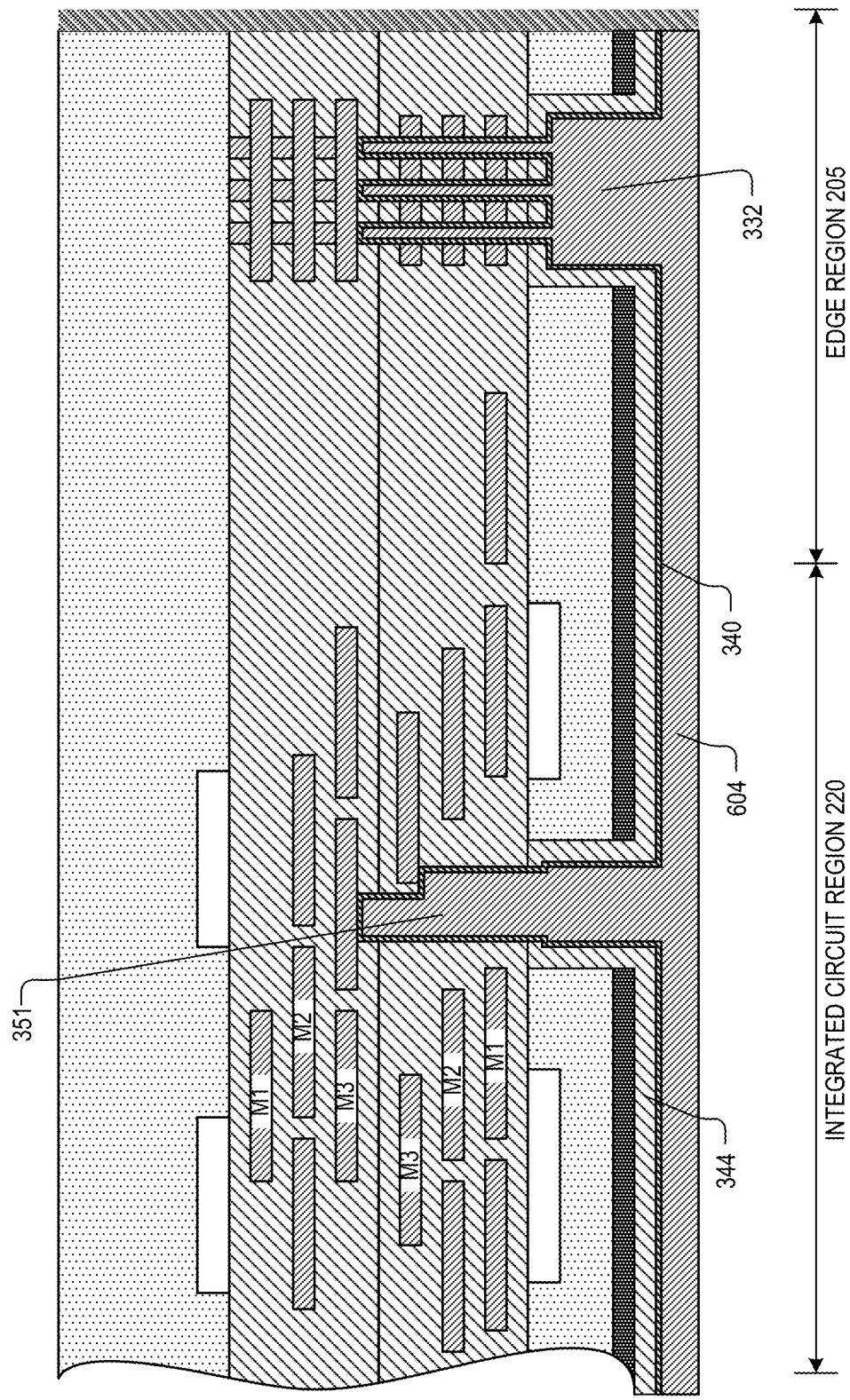

In process block 540 and FIG. 6F, a barrier metal 340 is deposited on the backside 305 of device wafer 306 and in the extended openings 348 and 334. Similar to the etching processes described above barrier metal 340 may be deposited simultaneously in opening 334 and 348. Next, in process block 545 and FIG. 6G, openings 334 and 348 are filled with a conductive material (e.g., metal 604) to form the integrated circuit region interconnect 351 and the edge region seal ring 332. The filling of openings 334 and 348 with metal may also be done simultaneously in the same process step. Thus the metal 604 in interconnect 351 may be the same as the metal in seal ring 332.

Figure 6H:
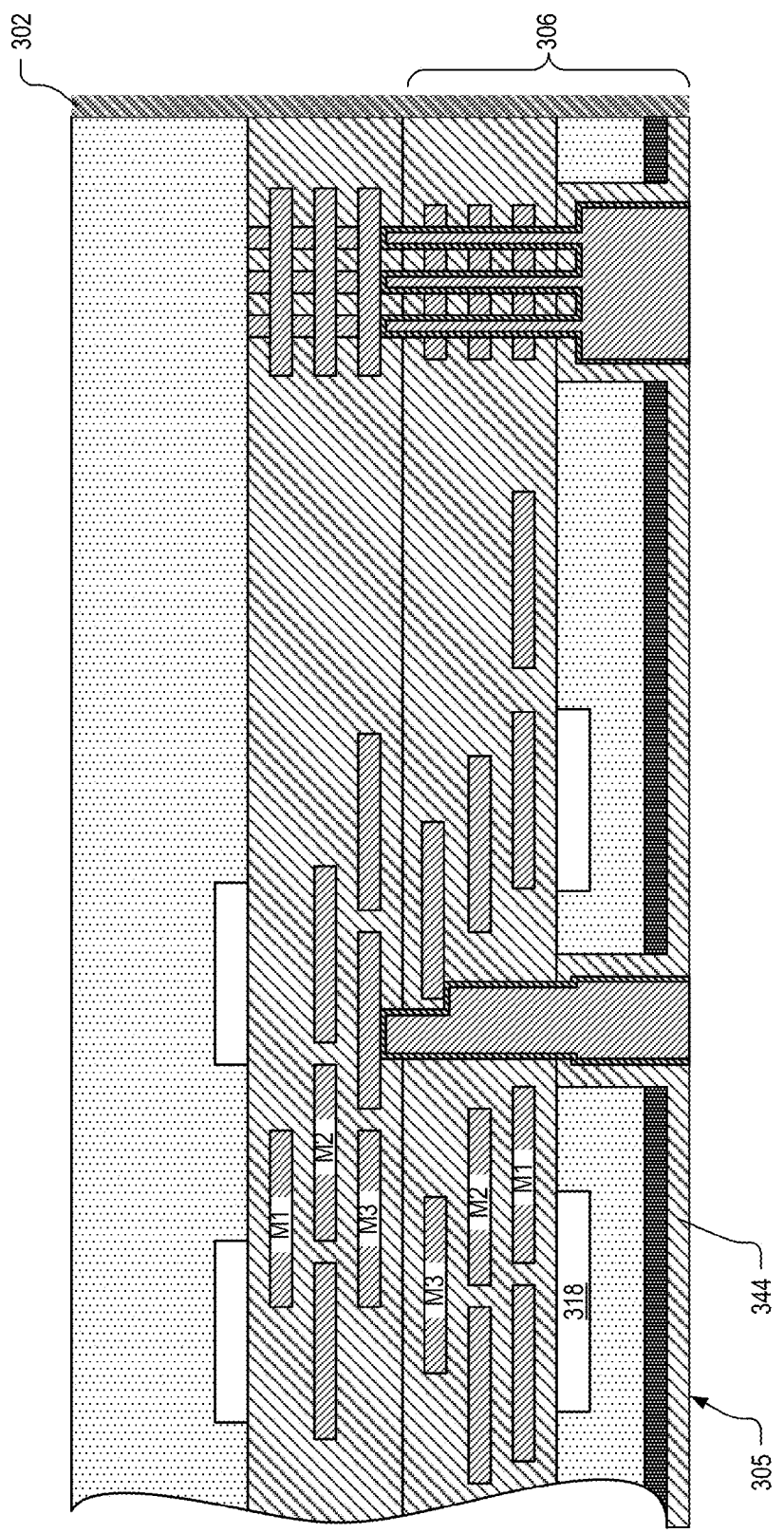

Process block 550 and FIG. 6H illustrate the removal of excess material from the backside 305 of device wafer 306. The removal of excess metal 604 and barrier metal 340 may be done by way of an etch or by way of a mechanical polish. Regardless, excess material is removed down to the oxide deposition 344. Next in process block 555 a wire bond cavity such as wire bond cavity 352 of FIG. 3 is formed.

Lastly, in process block 560, the fabrication of the integrated circuit system 300 is completed. In the embodiment where semiconductor region 318 includes an imaging array, completing the fabrication of integrated circuit system 300 may include steps such as formation of micro-lens (not shown) on the backside 305 and may also include die sawing along scribe line 302 to separate the individual dies from one another.

Figure 7:
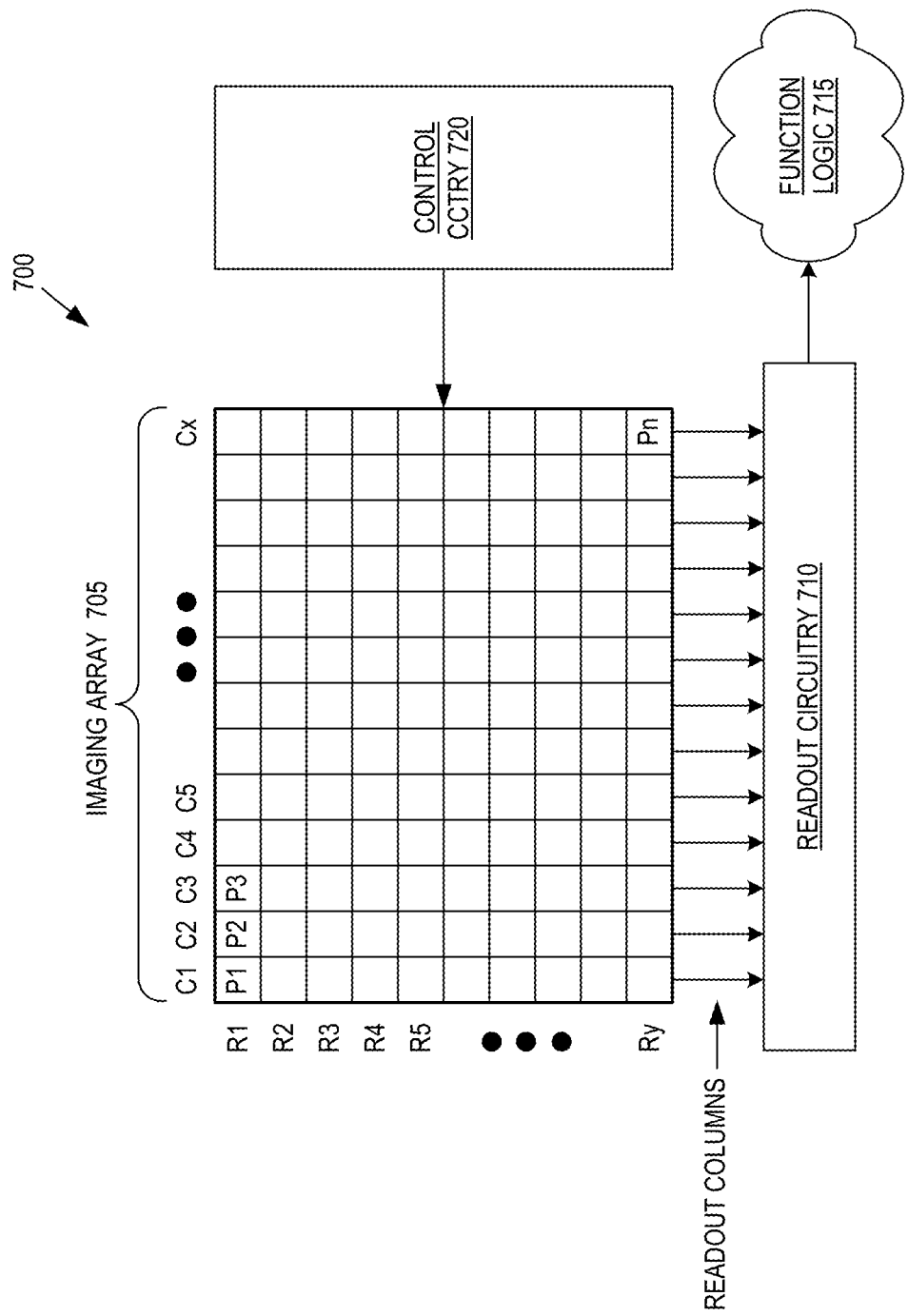
FIG. 7 is a functional block diagram illustrating an embodiment of a CMOS image sensor, in accordance with an embodiment of the invention.

FIG. 7 is a functional block diagram illustrating an embodiment of a CMOS image sensor 700, in accordance with an embodiment of the invention. CMOS image sensor 700 may be one implementation of any of the semiconductor regions mentioned previously, including semiconductor regions 318, 320, 322, and 324. The illustrated embodiment of image sensor 700 includes a imaging array 705, readout circuitry 710, function logic 715, and control circuitry 720.

Imaging array 705 is a two-dimensional ("2D") array of backside illuminated imaging sensors or pixels (e.g., pixels P1, P2 . . . , Pn). In one embodiment, each pixel is an active pixel sensor ("APS"), such as a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is read out by readout circuitry 710 and transferred to function logic 715. Readout circuitry 710 can include amplification circuitry, analog-to-digital ("ADC") conversion circuitry, or otherwise. Function logic 715 can simply store the image data or even manipulate the image data by applying post image effects (e.g., crop, rotate, remove red eye, adjust brightness, adjust contrast, or otherwise). Control circuitry 720 is coupled to pixel array 705 to control operational characteristic of pixel array 705.

Figure 8:
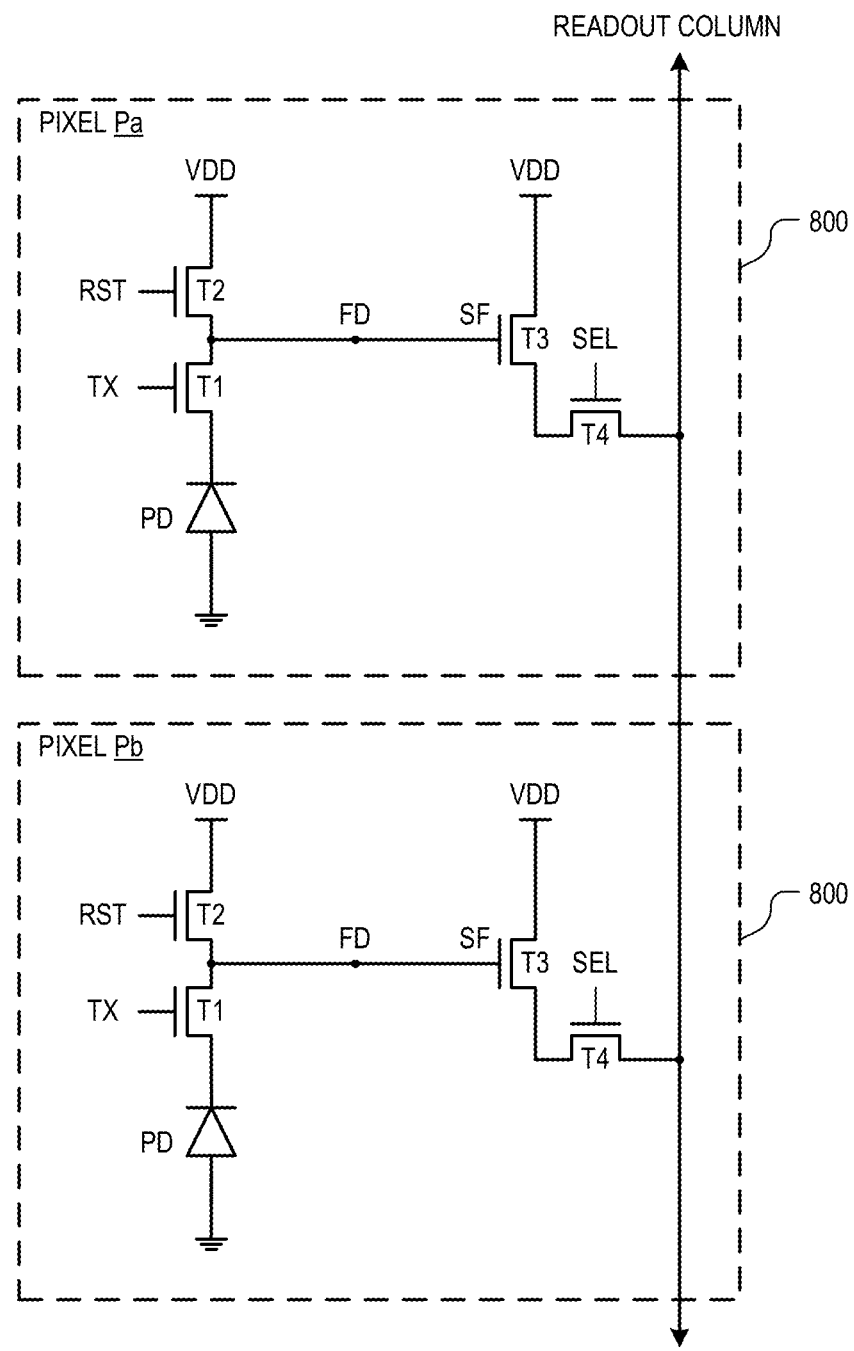
FIG. 8 is a circuit diagram illustrating pixel circuitry of two four-transistor ("4T") pixels within an embodiment of a CMOS imaging array.

FIG. 8 is a circuit diagram illustrating an embodiment of pixel circuitry 800 of two four-transistor ("4T") pixels within a BSI imaging array, in accordance with an embodiment of the invention. Pixel circuitry 800 is one possible pixel circuitry architecture for implementing each pixel within pixel array 705 of FIG. 7, but it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures. In FIG. 7, BSI pixels Pa and Pb are arranged in two rows and one column. The illustrated embodiment of each pixel circuitry 800 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD. In one embodiment, floating diffusion node FD can be coupled to a storage capacitor for temporarily storing image charges. Reset transistor T2 is coupled between a power rail VDD and the floating diffusion node FD to reset (e.g., discharge or charge the FD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance output from the pixel. Finally, select transistor T4 selectively couples the output of pixel circuitry 800 to the readout column line under control of a select signal SEL. In one embodiment, the TX signal, the RST signal, and the SEL signal are generated by control circuitry 720.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An integrated circuit system comprising
a first die including:
a first device formed in an integrated circuit region of a first semiconductor layer, and
a first metal stack formed on the first semiconductor layer, the first metal stack including one or more metal layers formed in a dielectric layer;
a second die including:
a second device formed in an integrated circuit region of a second semiconductor layer, and
a second metal stack formed on the second semiconductor layer, the second metal stack including one or more metal layers formed in a dielectric layer;
wherein a front side of the first die is bonded to a front side of the second die by bonding the first metal stack to the second metal stack along a bonding interface between the dielectric layer of the first metal stack and the dielectric layer of the second metal stack; and
a two-part seal ring including:
a first seal ring formed in an edge region of the first die, wherein the first seal ring is formed in the first metal stack, surrounds the integrated circuit region of the first die, and includes at least one via coupled to at least one metal layer of the first metal stack, and
a second seal ring formed in an edge region of the second die, wherein the second seal ring surrounds the integrated circuit region of the second die, and wherein the second seal ring includes:
a conductive path that extends from a backside of the second die through the second semiconductor layer, the second metal stack, and the bonding interface to the first seal ring, wherein the conductive path is electrically coupled to at least one metal layer of the second metal stack and is electrically coupled to at least one via of the first seal ring or at least one metal layer of the first metal stack.

2. The integrated circuit system of claim 1 wherein a width of the conductive path at the bonding interface is less than a width of the conductive path where the second metal stack meets the second semiconductor layer.

3. The integrated circuit system of claim 1 wherein the conductive path includes a barrier metal deposition and wherein the second seal ring is electrically coupled to the first seal ring through the barrier metal.

4. The integrated circuit system of claim 1, further comprising an oxide layer disposed between the conductive path and the second semiconductor layer.

5. The integrated circuit system of claim 4, further comprising a passivation layer disposed between a back side of the second die and the second semiconductor layer.

6. An imaging sensor system comprising:
a first die including:
a first device formed in an integrated circuit region of a first semiconductor layer, and
a first metal stack formed on the first semiconductor layer, the first metal stack including one or more metal layers formed in a dielectric layer;
a second die including:
a second device formed in an integrated circuit region of a second semiconductor layer, wherein one of the first device and the second device includes a complementary metal oxide semiconductor (CMOS) imaging array, and a second metal stack formed on the second semiconductor layer, the second metal stack including one or more metal layers formed in a dielectric layer;

wherein a front side of the first die is bonded to a front side of the second die by bonding the first metal stack to the second metal stack along a bonding interface between the dielectric layer of the first metal stack and the dielectric layer of the second metal stack; and a two-part seal ring including:
- a first seal ring formed in an edge region of the first die, wherein the first seal ring is formed in the first metal stack, surrounds the integrated circuit region of the first die, and includes at least one via coupled to at least one metal layer of the first metal stack, and
- a second seal ring formed in an edge region of the second die, wherein the second seal ring surrounds the integrated circuit region of the second die, and wherein the second seal ring includes:
  - a conductive path that extends from a backside of the second die through the second semiconductor layer, the second metal stack, and the bonding interface to the first seal ring, wherein the conductive path is electrically coupled to at least one metal layer of the second metal stack and is electrically coupled to at least one via of the first seal ring or at least one metal layer of the first metal stack.

7. The imaging sensor system of claim 6 wherein a width of the first conductive path at the bonding interface is less than a width of the conductive path where the second metal stack meets the second semiconductor layer.

8. The imaging sensor system of claim 6 wherein the conductive path includes a barrier metal deposition and wherein the second seal ring is electrically coupled to the first seal ring through the barrier metal.

9. The imaging sensor system of claim 6, further comprising an oxide deposition disposed between the conductive path and the second semiconductor layer.

10. The imaging sensor system of claim 9, further comprising a passivation layer disposed between a back side of the second die and the second semiconductor layer.

11. The imaging sensor system of claim 6, wherein the other one of the first device and the second device is a device selected from the group consisting of an image processor and memory.

12. The imaging sensor system of claim 6 wherein the imaging array includes a plurality of CMOS image pixels arranged into a plurality of rows and columns, wherein the image pixels are adapted to receive light from the back side of the second die.

* * * * *